US011062959B2

(12) United States Patent
Cheng et al.

(10) Patent No.: US 11,062,959 B2
(45) Date of Patent: Jul. 13, 2021

(54) INNER SPACER AND JUNCTION FORMATION FOR INTEGRATING EXTENDED-GATE AND STANDARD-GATE NANOSHEET TRANSISTORS

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 205 days.

(21) Appl. No.: 15/924,852

(22) Filed: Mar. 19, 2018

(65) Prior Publication Data

US 2019/0287864 A1    Sep. 19, 2019

(51) Int. Cl.
*H01L 21/8234* (2006.01)
*H01L 21/8238* (2006.01)
(Continued)

(52) U.S. Cl.
CPC ........... *H01L 21/823821* (2013.01); *H01L 21/02603* (2013.01); *H01L 27/0924* (2013.01);
(Continued)

(58) Field of Classification Search
CPC . H01L 29/0673; H01L 21/84; H01L 27/1203; H01L 29/7827; H01L 29/66666;
(Continued)

(56) References Cited

U.S. PATENT DOCUMENTS 8,492,228 B1 *  7/2013  Leobandung ..... H01L 21/823443
                                                  257/308
9,490,335 B1   11/2016  Doris et al.
(Continued)

OTHER PUBLICATIONS

Anonymous, "Method to Tune EG vs. SG Junction Loading," IPCOM000250854D, Sep. 2017, 6 pages.
(Continued)

*Primary Examiner* — Mary A Wilczewski
*Assistant Examiner* — Tsz K Chiu
(74) *Attorney, Agent, or Firm* — Cantor Colburn LLP; Randall Bluestone

(57) ABSTRACT

Embodiments of the invention are directed to a first nanosheet transistor device and a second nanosheet transistor device formed on a substrate. The first nanosheet transistor includes a first inner spacer having a first inner spacer thickness, along with a first gate dielectric having a first gate dielectric thickness. The second nanosheet transistor includes a second inner spacer having a second inner spacer thickness, along with a second gate dielectric having a second gate dielectric thickness. The first inner spacer thickness is greater than the second inner spacer thickness. The first gate dielectric thickness is greater than the second gate dielectric thickness. The first inner spacer thickness combined with the first gate dielectric thickness defines a first combined thickness. The second inner spacer thickness combined with the second gate dielectric thickness defines a second combined thickness. The first combined thickness is substantially equal to the second combined thickness.

17 Claims, 13 Drawing Sheets

(51) Int. Cl.
*H01L 29/06* (2006.01)
*H01L 29/66* (2006.01)
*H01L 21/02* (2006.01)
*H01L 27/092* (2006.01)
*H01L 29/423* (2006.01)
*H01L 29/786* (2006.01)

(52) U.S. Cl.
CPC ...... *H01L 29/0653* (2013.01); *H01L 29/0673* (2013.01); *H01L 29/42392* (2013.01); *H01L 29/66553* (2013.01); *H01L 29/78696* (2013.01)

(58) Field of Classification Search
CPC ........... H01L 29/41741; H01L 29/0676; H01L 29/0649; H01L 29/66439; H01L 29/1033; H01L 27/1211; H01L 29/66553; H01L 29/66795; H01L 29/6653; H01L 29/42392; H01L 29/0847; H01L 29/66545; H01L 29/6656; H01L 29/78696; H01L 29/775; H01L 29/1079; H01L 27/0924; H01L 21/823456; H01L 21/823468; H01L 21/823462; H01L 21/823412; H01L 21/0259; H01L 21/0262; H01L 21/02532
See application file for complete search history.

(56) References Cited

U.S. PATENT DOCUMENTS

| | | | |
|---|---|---|---|
| 9,647,139 B2 * | 5/2017 | Doris | H01L 21/02603 |
| 9,653,289 B1 * | 5/2017 | Balakrishnan | H01L 29/4983 |
| 9,755,071 B1 | 9/2017 | Anderson et al. | |
| 9,806,161 B1 | 10/2017 | Khan et al. | |
| 9,818,650 B2 | 11/2017 | Doris et al. | |
| 9,935,014 B1 * | 4/2018 | Cheng | H01L 21/823412 |
| 10,141,403 B1 * | 11/2018 | Cheng | H01L 29/0603 |
| 10,243,054 B1 * | 3/2019 | Cheng et al. | H01L 29/42376 |
| 10,381,490 B2 * | 8/2019 | Kim | H01L 27/0922 |
| 10,553,679 B2 * | 2/2020 | Zhang | H01L 29/66439 |
| 10,886,415 B2 * | 1/2021 | Lee | B82Y 10/00 |
| 10,903,317 B1 * | 1/2021 | Frougier | H01L 29/66545 |
| 10,930,764 B2 * | 2/2021 | Tapily | H01L 29/0673 |
| 10,930,795 B2 * | 2/2021 | Chen | H01L 29/0673 |
| 2014/0001441 A1 * | 1/2014 | Kim | H01L 29/0673 257/29 |
| 2014/0151639 A1 * | 6/2014 | Chang | H01L 27/1211 257/27 |
| 2017/0194143 A1 * | 7/2017 | Balakrishnan | H01L 21/823431 |
| 2017/0250261 A1 * | 8/2017 | Kim | H01L 29/66742 |
| 2017/0263704 A1 | 9/2017 | Kittl et al. | |
| 2017/0294519 A1 | 10/2017 | Khan et al. | |
| 2017/0338328 A1 | 11/2017 | Wang et al. | |
| 2018/0076095 A1 * | 3/2018 | Cheng | H01L 29/4908 |
| 2018/0331232 A1 * | 11/2018 | Frougier | H01L 29/78696 |
| 2019/0058052 A1 * | 2/2019 | Frougier | H01L 29/0847 |
| 2019/0074362 A1 * | 3/2019 | Lee | H01L 29/66553 |
| 2019/0096996 A1 * | 3/2019 | Song | H01L 27/0886 |
| 2019/0109052 A1 * | 4/2019 | Reznicek | H01L 29/42392 |
| 2019/0122937 A1 * | 4/2019 | Cheng | H01L 21/02532 |
| 2019/0131395 A1 * | 5/2019 | Lee | H01L 21/324 |
| 2019/0131396 A1 * | 5/2019 | Zhang | H01L 29/0673 |
| 2019/0157414 A1 * | 5/2019 | Ando | H01L 29/4991 |
| 2019/0165135 A1 * | 5/2019 | Cheng | H01L 29/66818 |
| 2019/0181224 A1 * | 6/2019 | Zhang | H01L 29/0673 |
| 2019/0189769 A1 * | 6/2019 | Basker | H01L 29/78618 |
| 2019/0189806 A1 * | 6/2019 | Leobandung | H01L 29/78696 |
| 2019/0296128 A1 * | 9/2019 | Smith | H01L 29/66772 |

OTHER PUBLICATIONS

Anonymous, "Steep-Slope Resonant Tunneling Nanosheet-FET (RT-NSFET)," IPCOM000250688D, Aug. 2017, 8 pages.

\* cited by examiner

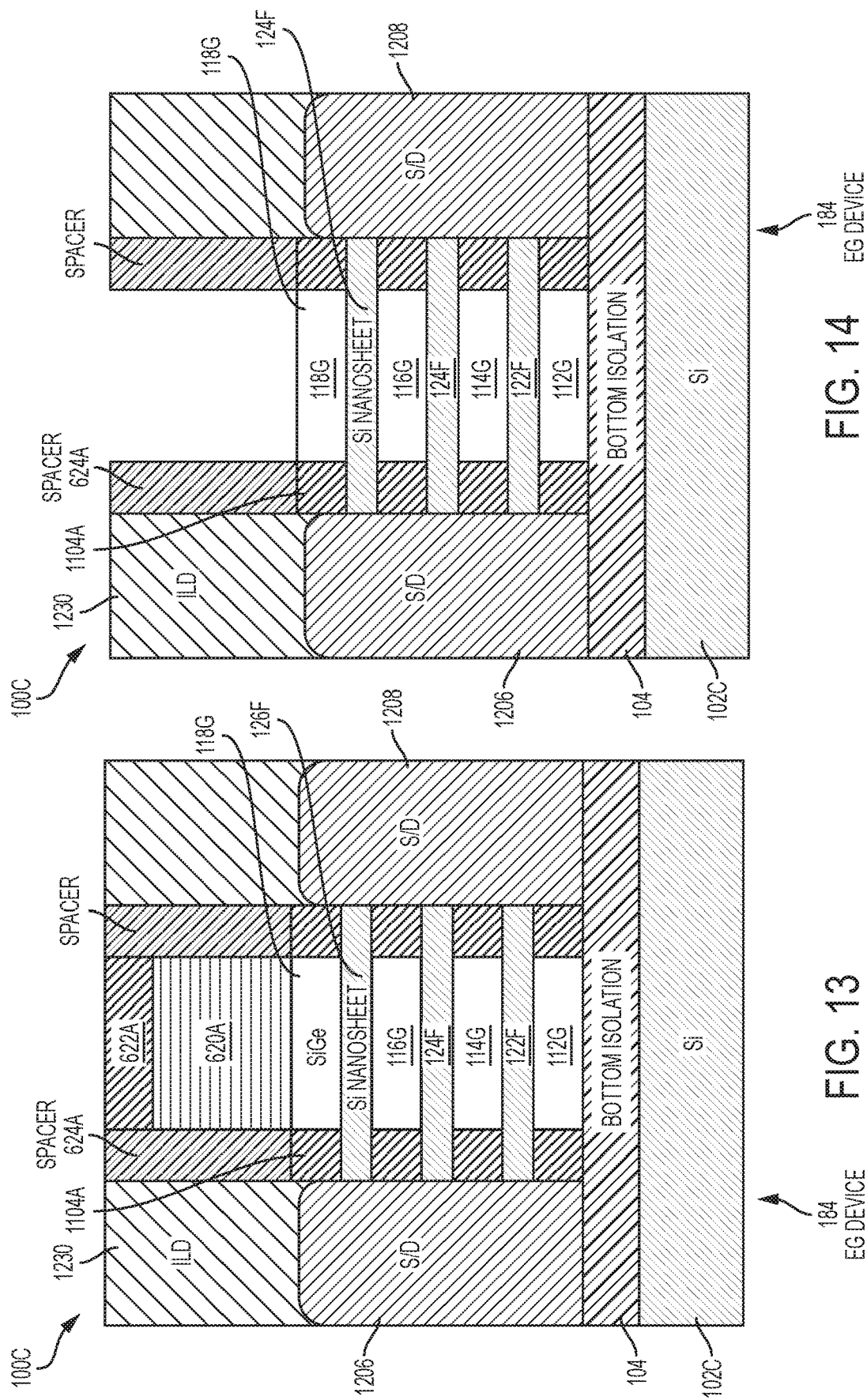

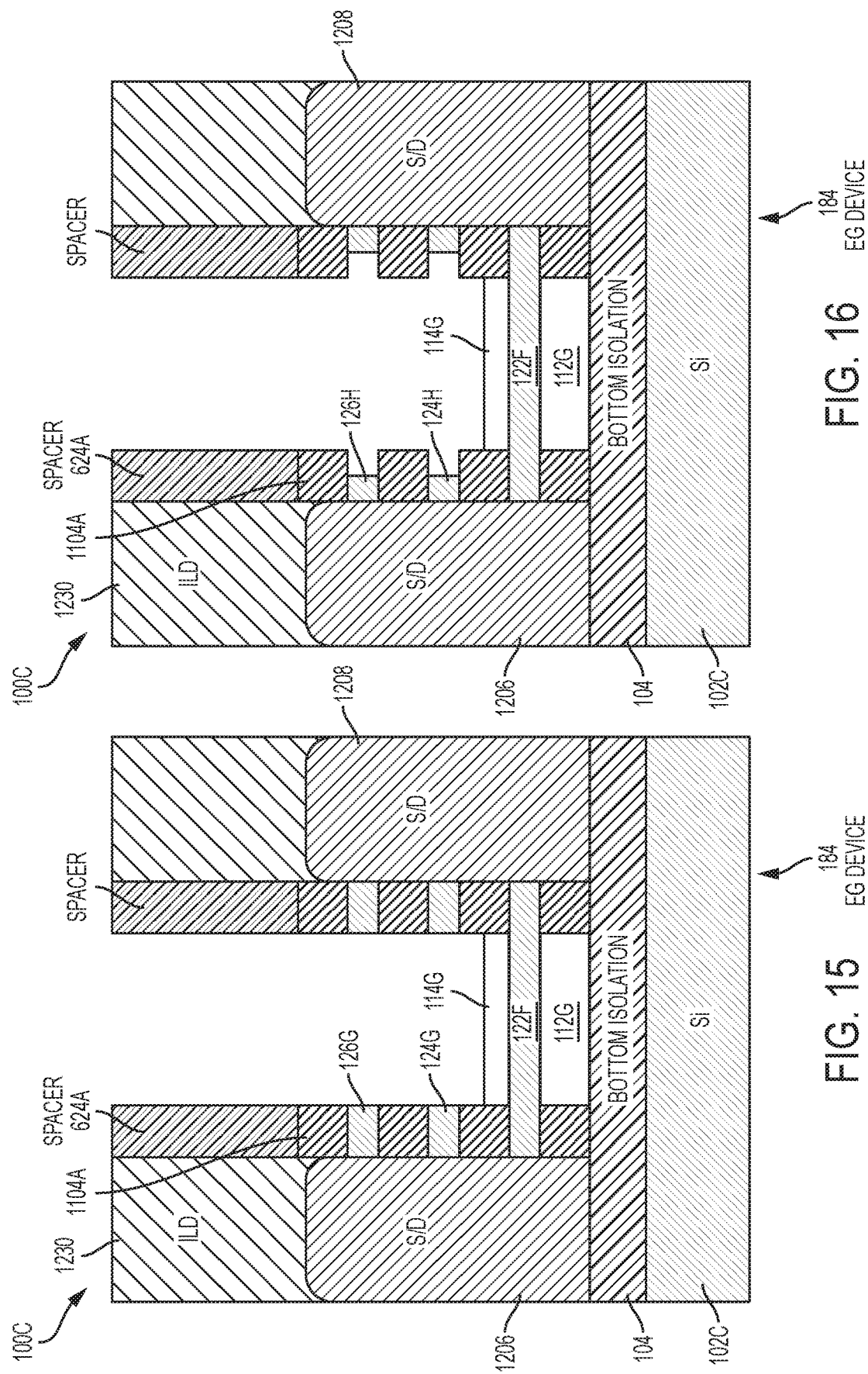

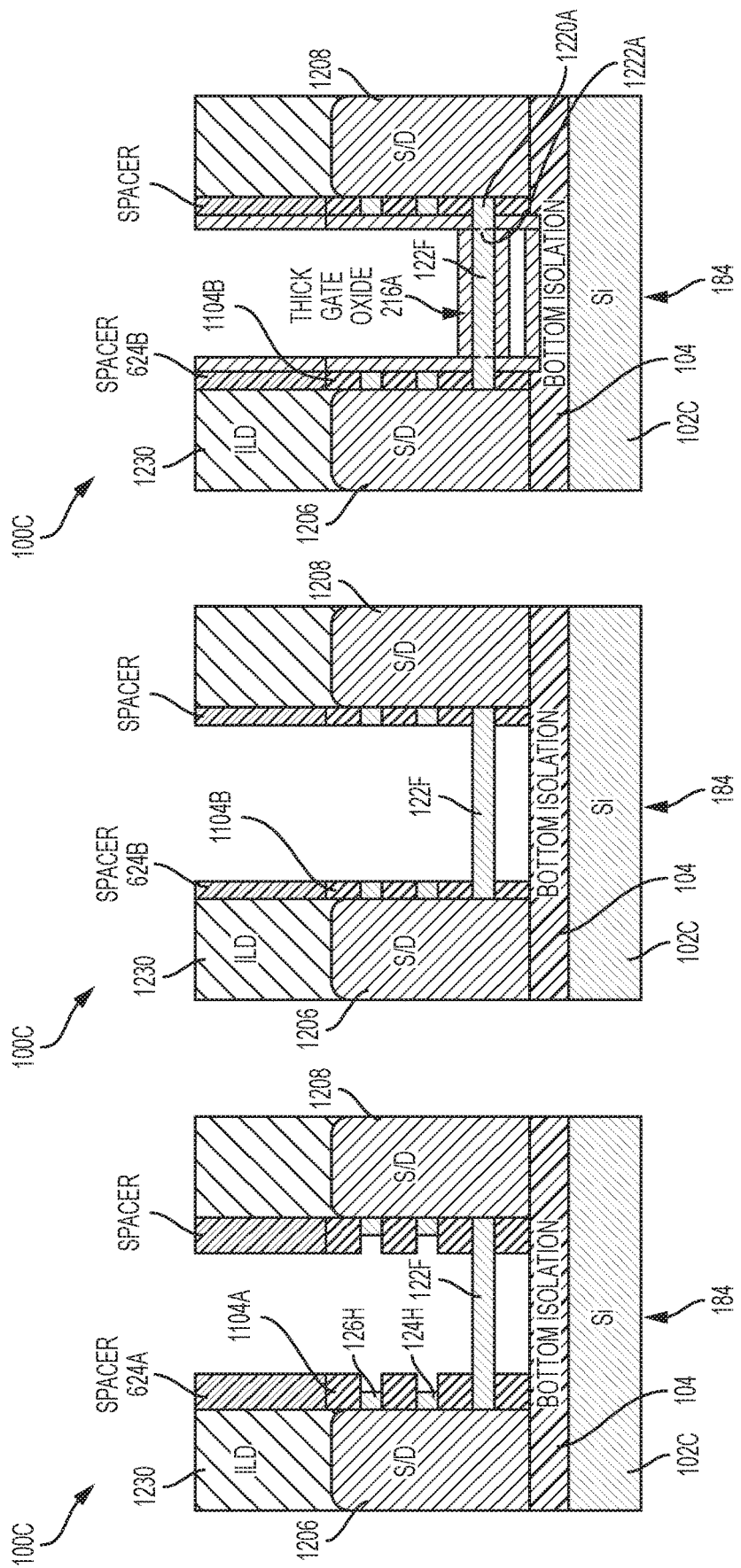

INNER SPACER AND JUNCTION FORMATION FOR INTEGRATING EXTENDED-GATE AND STANDARD-GATE NANOSHEET TRANSISTORS

BACKGROUND

The present invention relates in general to fabrication methods and resulting structures for semiconductor devices. More specifically, the present invention relates to fabrication methods and resulting structures for forming inner spacers and junctions in an extended-gate, vertically stacked nanosheet transistor.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow. Nanosheet transistor configurations enable fuller depletion in the nanosheet channel regions and reduce short-channel effects. In order to increase the maximum gate voltage of certain transistors, so-called extended gate (EG) nanosheet transistors have been developed that include a larger volume of gate metal and/or a thicker gate oxide than so-called standard-gate (SG) nanosheet transistors.

SUMMARY

Embodiments of the invention are directed to method of fabricating a semiconductor device. A non-limiting embodiment of the method includes performing fabrication operations to form nanosheet field effect transistor devices on a substrate, wherein the fabrication operations include forming a first nanosheet transistor device and a second nanosheet transistor device on a substrate. Forming the first nanosheet transistor includes forming a first inner spacer having a first inner spacer thickness dimension, along with forming a first gate dielectric having a first gate dielectric thickness dimension. Forming the second nanosheet transistor includes forming a second inner spacer having a second inner spacer thickness dimension, along with forming a second gate dielectric having a second gate dielectric thickness dimension. The first inner spacer thickness dimension is greater than the second inner spacer thickness dimension. The first gate dielectric thickness dimension is greater than the second gate dielectric thickness dimension. The first inner spacer thickness dimension combined with the first gate dielectric thickness dimension defines a first combined thickness dimension, and the second inner spacer thickness dimension combined with the second gate dielectric thickness dimension defines a second combined thickness dimension. The first combined thickness dimension is substantially equal to the second combined thickness dimension.

Embodiments of the invention are directed to a method of fabricating a semiconductor device. A non-limiting embodiment of the method includes performing fabrication operations to form nanosheet field effect transistor devices on a substrate. The fabrication operations include forming a first nanosheet transistor device and a second nanosheet transistor device on a substrate. Forming the first nanosheet transistor includes forming a first inner spacer having a first inner spacer thickness dimension; forming a first gate dielectric having a first gate dielectric thickness dimension; forming a first gate adjacent the first gate dielectric; and forming a first nanosheet channel positioned under the first inner spacer, the first gate dielectric, and the first gate. The first nanosheet channel includes a first source/drain (S/D) extension region positioned under the first inner spacer and the first gate dielectric. The first nanosheet channel includes a first nanosheet channel body positioned under the gate. Forming the second nanosheet transistor includes forming a second inner spacer having a second inner spacer thickness dimension; forming a second gate dielectric having a second gate dielectric thickness dimension; forming a second gate adjacent the second gate dielectric; and forming a second nanosheet channel positioned under the second inner spacer, the second gate dielectric, and the second gate. The second nanosheet channel includes a second source/drain (S/D) extension region positioned under the second inner spacer and the second gate dielectric. The second nanosheet channel includes a second nanosheet channel body positioned under the gate. The first inner spacer thickness dimension is greater than the second inner spacer thickness dimension. The first gate dielectric thickness dimension is greater than the second gate dielectric thickness dimension. The first inner spacer thickness dimension combined with the first gate dielectric thickness dimension defines a first combined thickness dimension. The second inner spacer thickness dimension combined with the second gate dielectric thickness dimension defines a second combined thickness dimension. The first combined thickness dimension is substantially the same as the second combined thickness dimension.

Embodiments of the invention are directed to a set of nanosheet field effect transistor devices formed on a substrate. A non-limiting example of the nanosheet field effect transistor devices includes a first nanosheet transistor device and a second nanosheet transistor device formed on the substrate. The first nanosheet transistor includes a first inner spacer having a first inner spacer thickness dimension, along with a first gate dielectric having a first gate dielectric thickness dimension. The second nanosheet transistor includes a second inner spacer having a second inner spacer thickness dimension, along with a second gate dielectric having a second gate dielectric thickness dimension. The first inner spacer thickness dimension is greater than the second inner spacer thickness dimension. The first gate dielectric thickness dimension is greater than the second gate dielectric thickness dimension. The first inner spacer thickness dimension combined with the first gate dielectric thickness dimension defines a first combined thickness dimension. The second inner spacer thickness dimension combined with the second gate dielectric thickness dimension defines a second combined thickness dimension. The first combined thickness dimension is substantially equal to the second combined thickness dimension.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 4-12 depict cross-sectional views of a section of a substrate/wafer after various fabrication operations to form an SG nanosheet transistor and an EG nanosheet transistor thereon according to embodiments of the invention, in which:

FIG. 4 depicts a cross-sectional view of the SG nanosheet transistor and the EG nanosheet transistor shown in FIG. 2 after a fabrication stage according to embodiments of the present invention;

FIG. 6 depicts a cross-sectional view of the SG nanosheet transistor and the EG nanosheet transistor shown in FIG. 2 after a fabrication stage according to embodiments of the present invention;

FIG. 7 depicts a cross-sectional view of the SG nanosheet transistor and the EG nanosheet transistor shown in FIG. 2 after a fabrication stage according to embodiments of the present invention;

FIG. 8 depicts a cross-sectional view of the SG nanosheet transistor and the EG nanosheet transistor shown in FIG. 2 after a fabrication stage according to embodiments of the present invention;

FIG. 9 depicts a cross-sectional view of the SG nanosheet transistor and the EG nanosheet transistor shown in FIG. 2 after a fabrication stage according to embodiments of the present invention;

FIG. 10 depicts a cross-sectional view of the SG nanosheet transistor and the EG nanosheet transistor shown in FIG. 2 after a fabrication stage according to embodiments of the present invention;

FIG. 11 depicts a cross-sectional view of the SG nanosheet transistor and the EG nanosheet transistor shown in FIG. 2 after a fabrication stage according to embodiments of the present invention;

FIG. 12 depicts a cross-sectional view of the SG nanosheet transistor and the EG nanosheet transistor shown in FIG. 2 after a fabrication stage according to embodiments of the present invention;

FIGS. 13-19 depict cross-sectional views of a section of a substrate/wafer after various fabrication operations to form an SG nanosheet transistor and an EG nanosheet transistor thereon according to embodiments of the invention, in which:

FIG. 13 depicts a cross-sectional view of the SG nanosheet transistor and the EG nanosheet transistor shown in FIG. 3 after a fabrication stage according to embodiments of the present invention;

FIG. 14 depicts a cross-sectional view of the SG nanosheet transistor and the EG nanosheet transistor shown in FIG. 3 after a fabrication stage according to embodiments of the present invention;

FIG. 15 depicts a cross-sectional view of the SG nanosheet transistor and the EG nanosheet transistor shown in FIG. 3 after a fabrication stage according to embodiments of the present invention;

FIG. 16 depicts a cross-sectional view of the SG nanosheet transistor and the EG nanosheet transistor shown in FIG. 3 after a fabrication stage according to embodiments of the present invention;

FIG. 17 depicts a cross-sectional view of the SG nanosheet transistor and the EG nanosheet transistor shown in FIG. 3 after a fabrication stage according to embodiments of the present invention;

FIG. 18 depicts a cross-sectional view of the SG nanosheet transistor and the EG nanosheet transistor shown in FIG. 3 after a fabrication stage according to embodiments of the present invention; and FIG. 19 depicts a cross-sectional view of the SG nanosheet transistor and the EG nanosheet transistor shown in FIG. 3 after a fabrication stage according to embodiments of the present invention.

DETAILED DESCRIPTION

Figure 1:
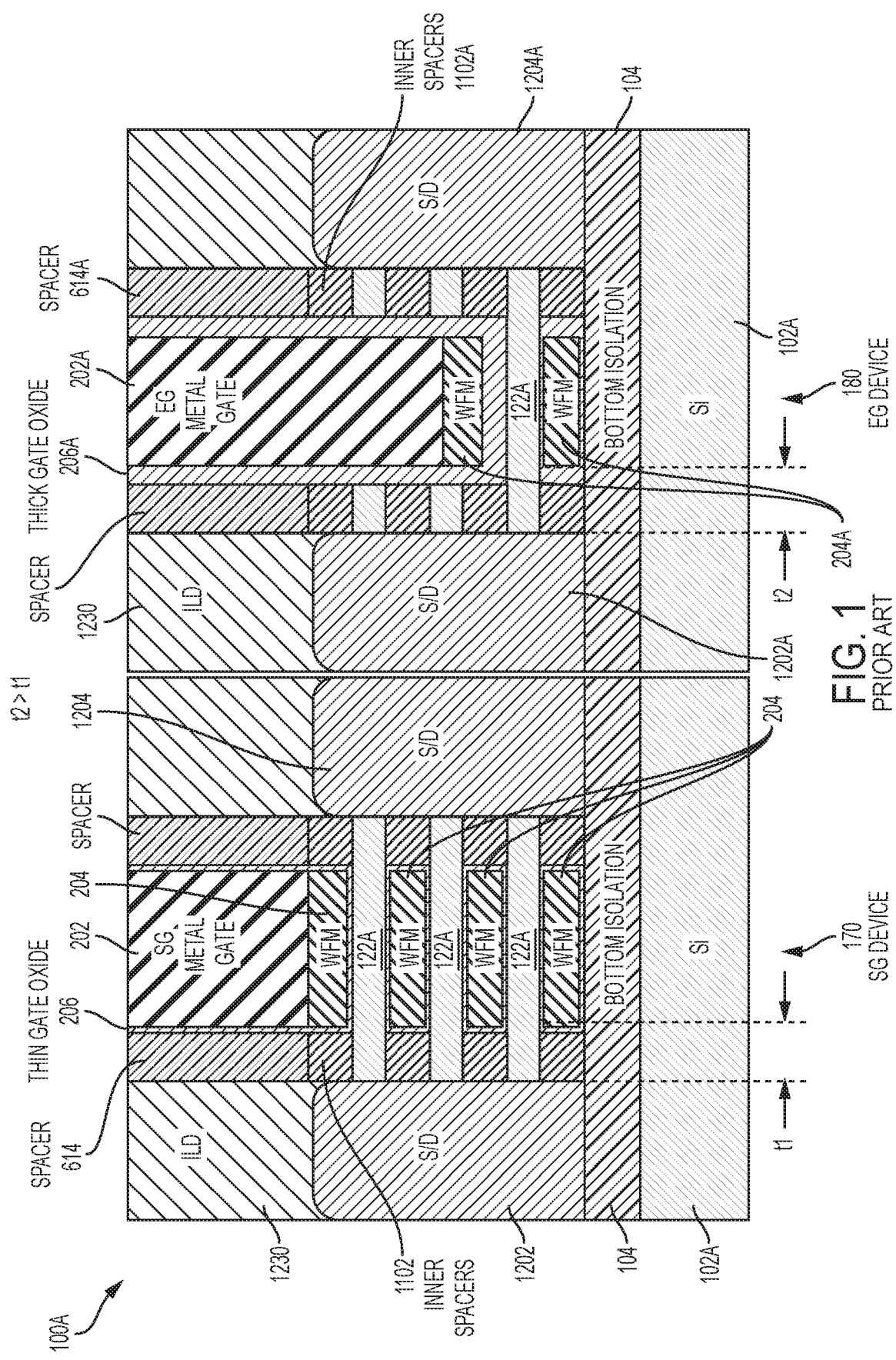
FIG. 1 depicts a cross-sectional view of a section of a substrate/wafer having a standard-gate (SG) nanosheet transistor and an extended-gate (EG) nanosheet transistor formed thereon according to known fabrication methodologies and resulting structures.

It is understood in advance that although this invention includes a detailed description of exemplary standard-gate (SG) and extended-gate (EG) GAA nanosheet FET architectures having silicon (Si) channels, embodiments of the invention are not limited to the particular FET architectures or materials described in this specification. Rather, embodiments of the present invention are capable of being implemented in conjunction with any other type of nanosheet/nanowire FET architecture or materials now known or later developed. Additionally, in this detailed description and the claims, the terms nanosheet and nanowire are treated as synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets are typically SiGe and the sacrificial nanosheets are typically Si. In some implementations, the channel nanosheet of a p-type FET can SiGe or Si. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. For example, to increase the maximum gate voltage (VT) of a nanosheet transistor, EG nanosheet transistors have been developed that include a larger volume of gate metal and/or a thicker gate oxide than SG nanosheet transistors.

FIG. 1 depicts a cross-sectional view of a section 100A of a substrate/wafer 102A having a known SG nanosheet transistor 170 and a known EG nanosheet transistor 180 formed thereon. The SG nanosheet transistor 170 and the EG nanosheet transistor 180 include a bottom isolation region 104 over the Si substrate 102A. The active regions of the SG nanosheet transistor 170 and the EG nanosheet transistor 180 are over the bottom isolation region 104. The active regions of the SG nanosheet transistor 170 includes stacked nanosheet channels 122A, 124A, 126A positioned between a source region 1202 and a drain region 1204. Multi-segmented gate metal regions 202, 204 and multi-segmented gate dielectric regions 206 are formed over and around the stacked nanosheet channels 122A, 124A, 126A in a GAA configuration. In the example shown in FIG. 1, the stacked nanosheet channels 122A, 124A, 126A are Si. The SG nanosheet transistor 170 also includes a portion of an interlayer dielectric (ILD) region 1230, gate spacers 614, and inner spacers 1104, configured and arranged as shown.

The active regions of the EG nanosheet transistor 180 include a nanosheet channels 122A positioned between a source region 1202A and a drain region 1204A. Multi-segmented gate metal regions 202A, 204A and multi-segmented gate dielectric regions 206A are formed over and around the nanosheet channel 122A in a GAA configuration. In the example shown in FIG. 1, the nanosheet channel 122A is Si. The EG nanosheet transistor 180 also includes a portion of the ILD region 1230, gate spacers 614A, and inner spacers 1102A, configured and arranged as shown.

As shown in FIG. 1, the EG nanosheet transistor 180 provides additional room for a larger EG metal gate 202A by eliminating the Si channel nanosheets 224A, 226A used in the SG nanosheet transistor 170, and instead utilizing only the last channel nanosheet 122A. A problem with this method is that the larger EG metal gate 202A requires a thicker gate dielectric 206A, which adds more distance from the S/D 1202A to the active portion of the nanosheet channel 122A compared to the SG nanosheet transistor 170 (t2>t1), which causes underlapped junctions for EG nanosheet transistor devices.

Turning now to an overview of aspects of the invention, embodiments of the invention provides fabrication methods and resulting structures for inner spacers and junctions in an EG, nanosheet transistor. Embodiments of the invention describe two example integration flows to adjust the junction of EG nanosheet transistor devices to match SG nanosheet transistor devices formed on the same substrate. One example integration flow results in the EG nanosheet transistor 182 shown in FIG. 2. In this example, the inner spacers of EG nanosheet transistor devices are trimmed to match the amount of the added EG oxide thickness. Another example integration flow results in the EG nanosheet transistor 184 shown in FIG. 3. In this example, a thinner inner spacer is created during inner spacer formation for the EG nanosheet transistor device 184. In either integration flow described herein, the total spacer/gate-oxide thickness will be the same for SG and EG nanosheet transistor devices (t3=t1). Because embodiments of the invention result in t1 being substantially the same as t3, aspects of facilitate the consistent fabrication of the necessary junctions to avoid underlapped junction in both the SG nanosheet transistor 172, 174 (shown in FIGS. 2 and 3) and the EG nanosheet transistor 182, 184 (shown in FIGS. 2 and 3).

Figure 4:
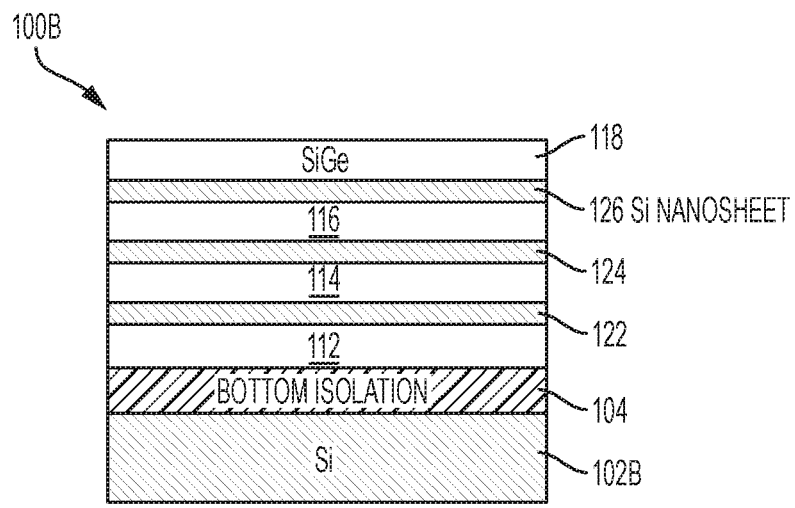

Turning now to a more detailed description of fabrication operations according to aspects of the invention, FIGS. 4-12 depict cross-sectional views of section 100B of the substrate/wafer 102B (shown in FIG. 2) after various fabrication operations to form an SG nanosheet transistor 172 and an EG nanosheet transistor 182 on the same substrate 102B in accordance with embodiments of the invention. As shown in FIG. 4, after initial stages of the described fabrication processes, the SG 172 and the EG 182 are the same. As shown in FIG. 4, a bottom isolation region (e.g., an oxide) 104 is formed over the substrate 102B, and an alternating series of SiGe sacrificial nanosheet layers 112, 114, 116, 118 and Si nanosheet layers 122, 124, 126 are formed in a stack on the bottom isolation 104. In some embodiments of the invention, the SiGe nanosheet layers 112, 114, 116, 118 can be SiGe 25%. The notation "SiGe 25%" is used to indicate that 25% of the SiGe material is Ge.

In embodiments of the invention, the alternating nanosheet layers depicted in FIG. 4 can be formed by epitaxially growing one layer and then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 5A:
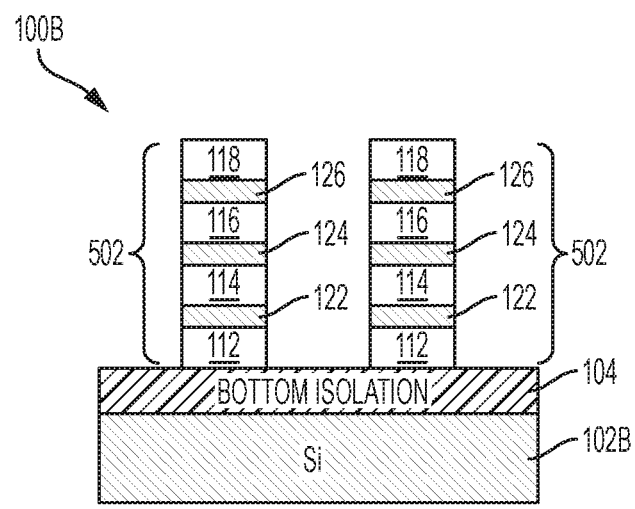
FIG. 5A depicts a cross-sectional view of the SG nanosheet transistor and the EG nanosheet transistor shown in FIG. 2 after a fabrication stage according to embodiments of the present invention.
Figure 5B:
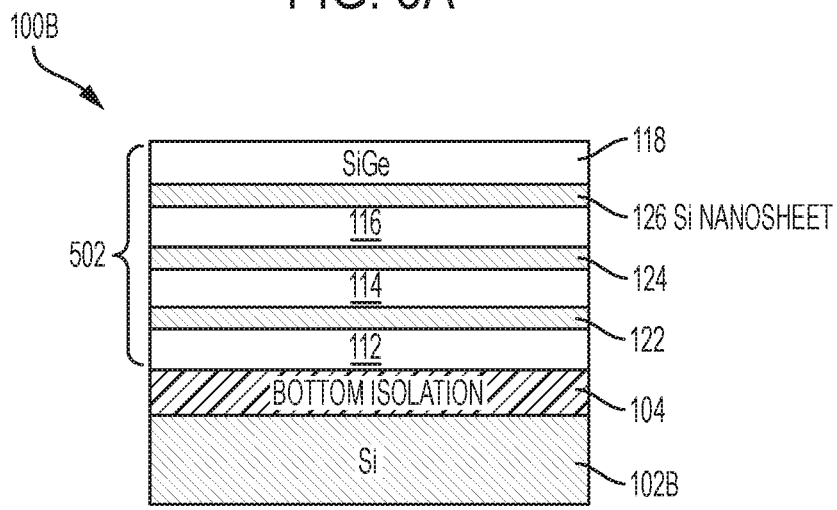
FIG. 5B depicts a cross-sectional view of the SG nanosheet transistor and the EG nanosheet transistor shown in FIG. 5A rotated 90 degrees counterclockwise into the page.

In FIGS. 5A and 5B, known semiconductor fabrication operations have been used to etch or recess the alternating nanosheet layers 112, 122, 114, 124, 116, 126, 118 shown in FIG. 4 to form multiple intermediate elongated columns 502. In an example fabrication process, a patterned hard mask (not shown) is deposited over the alternating nanosheet layers 112, 122, 114, 124, 116, 126, 118. The pattern of the hard mask defines the footprints of the multiple intermediate elongated columns 502 shown in FIGS. 5A and 5B. FIG. 5A is a view of the intermediate elongated columns 502 by a person standing in front the narrowest sidewalls of the intermediate elongated columns 502 (i.e., in the cross-fin direction). FIG. 5B is a view of one of the intermediate elongated columns 502 by a person standing in front of the elongated sidewall of one of the intermediate elongated columns 502 (i.e., in the along-fin direction). An etch (e.g., an RIE) or a recess is applied to remove the portions of the alternating nanosheet layers that are not covered by the patterned hard mask, thereby forming the intermediate elongated columns 502.

Figure 6:
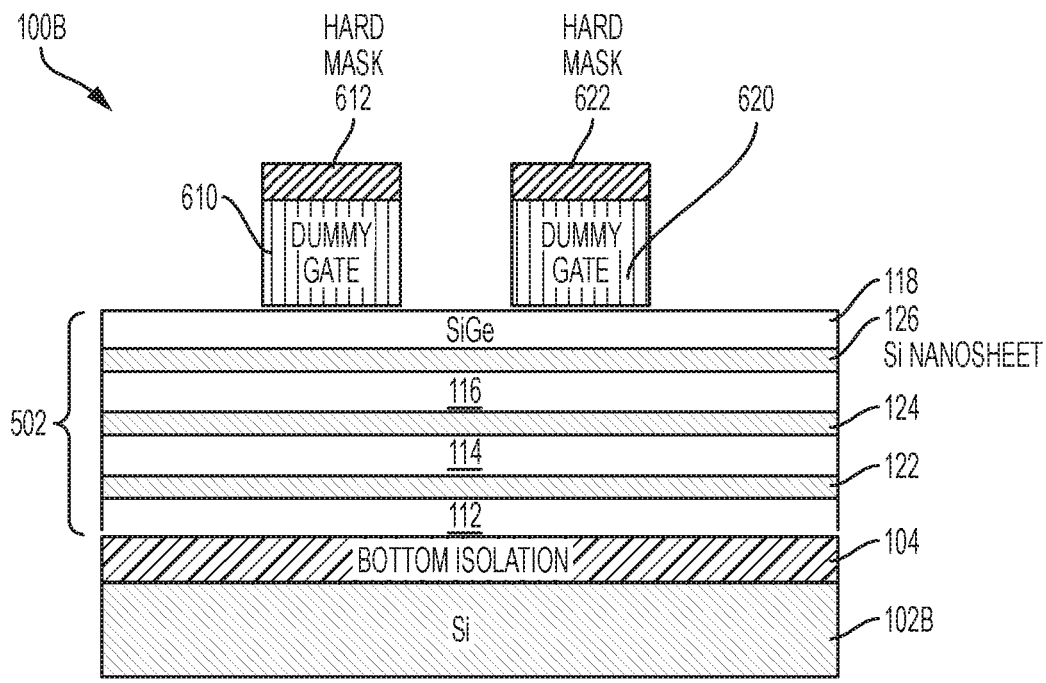

In FIG. 6, known semiconductor fabrication operations have been used to form dummy gates 610, 620 and hard masks 612, 622 that extend over and around each of the intermediate elongated columns 502. Although only one of the intermediate elongated fin-shaped columns 502 is shown in the two-dimensional (X-axis and Y-axis) cross-sectional diagram shown in FIG. 6, multiple additional intermediate elongated fin-shaped columns (not shown) are positioned behind the intermediate elongated fin-shaped column 502 and extend into the page in the Y-axis direction. The additional intermediate elongated fin-shaped columns positioned behind the intermediate elongated fin-shaped column 502 are substantially the same as the intermediate elongated fin-shaped column 502. Similarly, although the dummy gates 610, 620 are depicted in cross-sectional, two-dimensional views in FIG. 6, in practice, the dummy gates are formed over and around the sidewalls of each of the intermediate elongated fin-shaped columns 502.

The dummy gates 610, 620 can be formed by depositing amorphous silicon (a-Si) over and around the intermediate elongated columns 502. The a-Si is then planarized to a desired level. A hard mask layer (not shown) is deposited over the planarized a-Si and patterned to form the hard masks 612, 622. In embodiments of the invention, the hard masks 612, 622 can be formed from a nitride or an oxide layer. An etching process (e.g., an RIE) is applied to the a-Si to form the dummy gates 610, 620.

Figure 7:
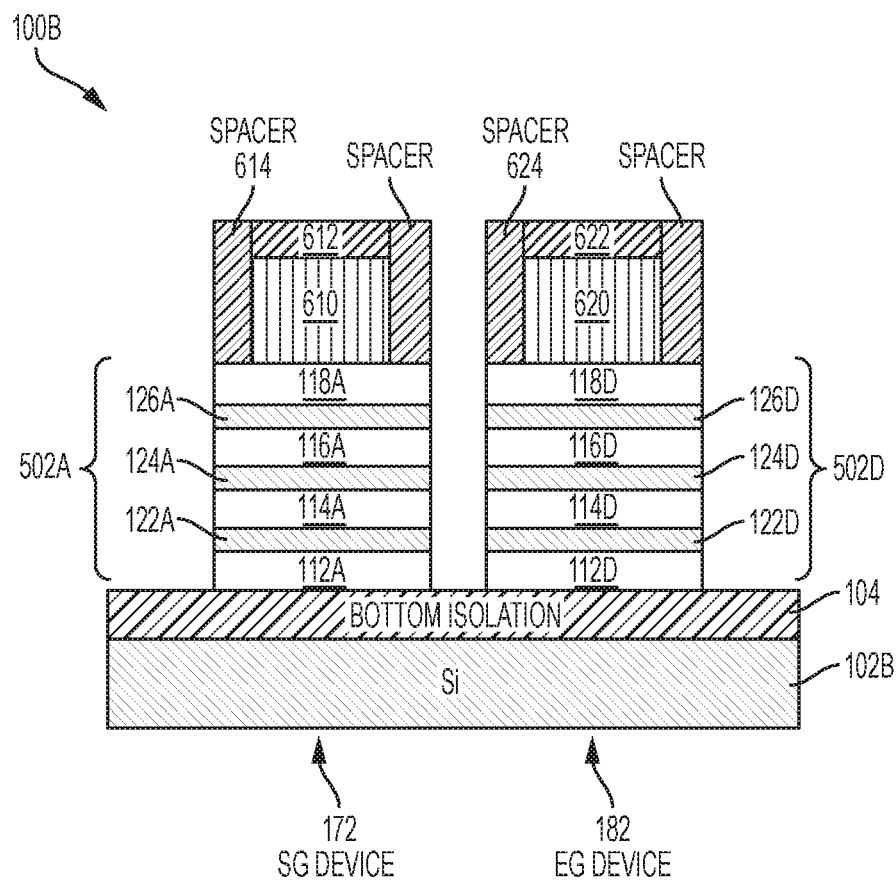

In FIG. 7, known semiconductor fabrication operations have been applied to the intermediate elongated fin-shaped columns offset gate spacers 614, 624 and fin-shaped columns 502A, 502C. The fin-shaped columns 502A are positioned in a region of the substrate 102B where the SG nanosheet transistors 172 (shown in FIG. 2) will be formed, and the fin-shaped columns 502C are positioned in a region of the substrate 102B where the EG nanosheet transistors 182 (shown in FIG. 2) will be formed. However, at the fabrication stage shown in FIG. 7, the structures that will become the SG nanosheet transistors 172 are configured and arranged in substantially the same manner as the structures that will be become the EG nanosheet transistors 182. Each of the fin-shaped columns 502A includes a stack of alternating SiGe/Si nanosheet regions 112A, 122A, 114A, 124A, 116A, 126A, 118A. Similarly, each of the fin-shaped columns 502C includes a stack of alternating SiGe/Si nanosheet regions 112C, 122C, 114C, 124C, 116C, 126C, 118C.

The offset gate spacers 614, 624 are formed along sidewalls of the dummy gates 610, 620, and then an etch or a recess is applied to the intermediate elongated columns 502 (shown in FIG. 6) to form a first set of the final fin-shaped columns 502A and a second set of the final fin-shaped columns 502C by etching or recessing the portions of the intermediate elongated fin-shaped columns 502 that are not covered by the dummy gates 610, 620 and the offset spacers 614, 624. The offset spacers 314, 324 can be formed using a spacer pull down formation process. The offset spacers 314, 324 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

Figure 8:
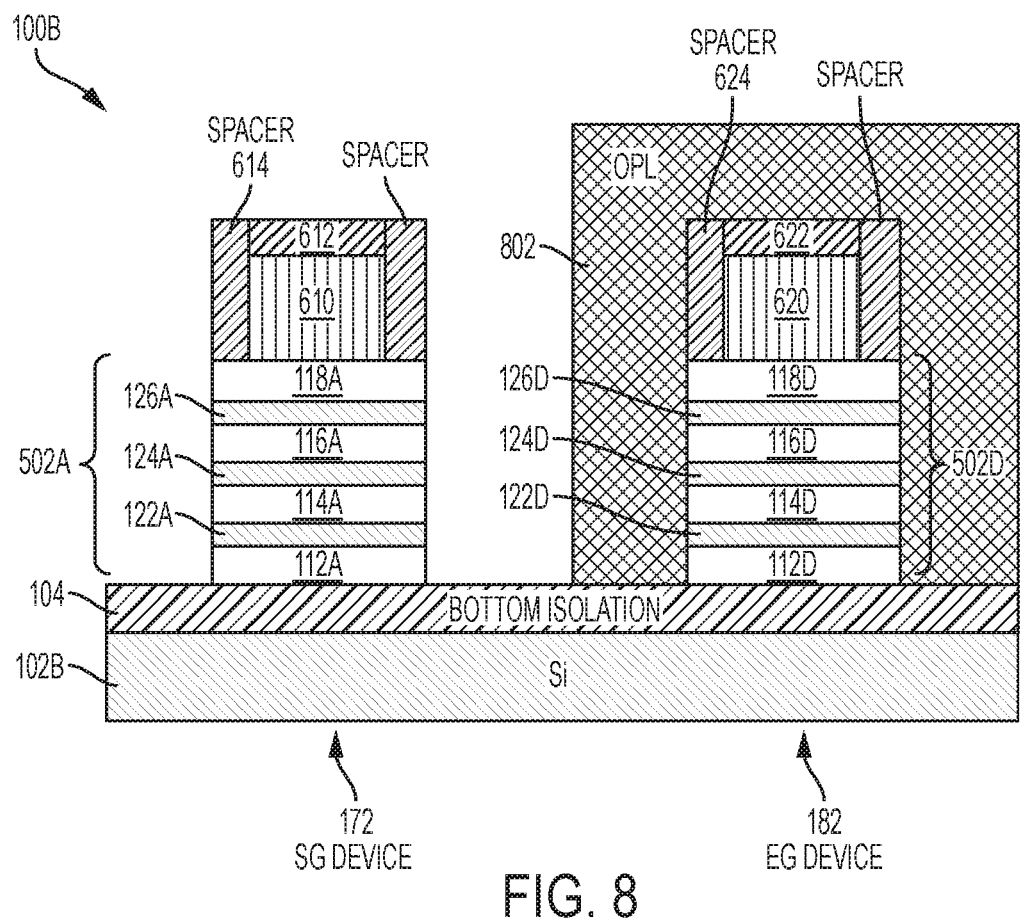
Figure 9:
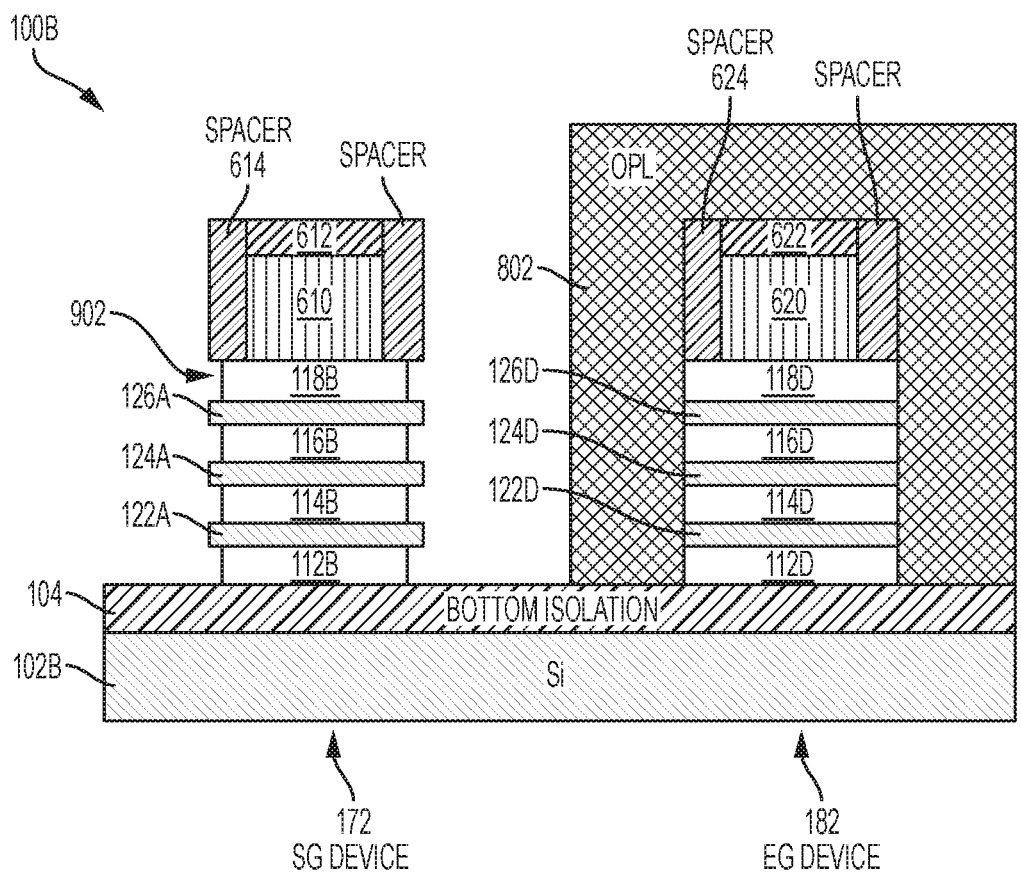

In FIG. 8, a block mask (e.g., an organic planarization layer (OPL)) 802 has been deposited to cover the EG 180 but not cover the SG 170. In FIG. 9, known semiconductor fabrication processes have been used to partially remove end regions of the SiGe sacrificial nanosheet regions 112A, 114A, 116A, 118A (shown in FIG. 8), thereby forming etched intermediate SiGe sacrificial nanosheet regions 112B, 114B, 116B, 118B and initial end region cavities 902. For example, the end regions of the SiGe nanosheet regions 112A, 114A, 116A, 118A can be removed using a first application of a so-called "pull-back" process to pull the SiGe nanosheet regions 112A, 114A, 116A, 118A back an initial pull-back distance such that the end regions terminate underneath the offset gate spacers 614. In embodiments of the invention, the pull-back process includes a hydrogen chloride (HCL) gas isotropic etch process, which etches SiGe without attacking Si. In conventional nanosheet fabrication processes, the SiGe nanosheet pull-back process would extend the thicknesses of the end region cavities to the full target amount for the SG nanosheet transistor 172. In embodiments of the invention, the full target amount is substantially commensurate with the thicknesses of the offset spacers 614. In other words, the end region cavities formed using conventional fabrication processes would extend completely underneath the offset gate spacers 614. However, in embodiments of the invention, the initial pull-back operation forms the end region cavities such that they extend partially underneath the offset gate spacers 614. For reasons that will be described in greater detail herein, in embodiments of the invention, the total pull-back distance for both of the initial end region cavities 902 of a given SiGe nanosheet region (e.g., 118A) is substantially equal to a dimension referred to herein as the total EG thickness. In embodiments of the invention, the total EG thickness is the difference between the thickness of the final metal gate structure (e.g., the metal gate and the gate dielectric) in the SG nanosheet transistor 172 and the thickness of the final metal gate structure (e.g., the metal gate and the gate dielectric) in the EG nanosheet transistor 182.

Figure 10:
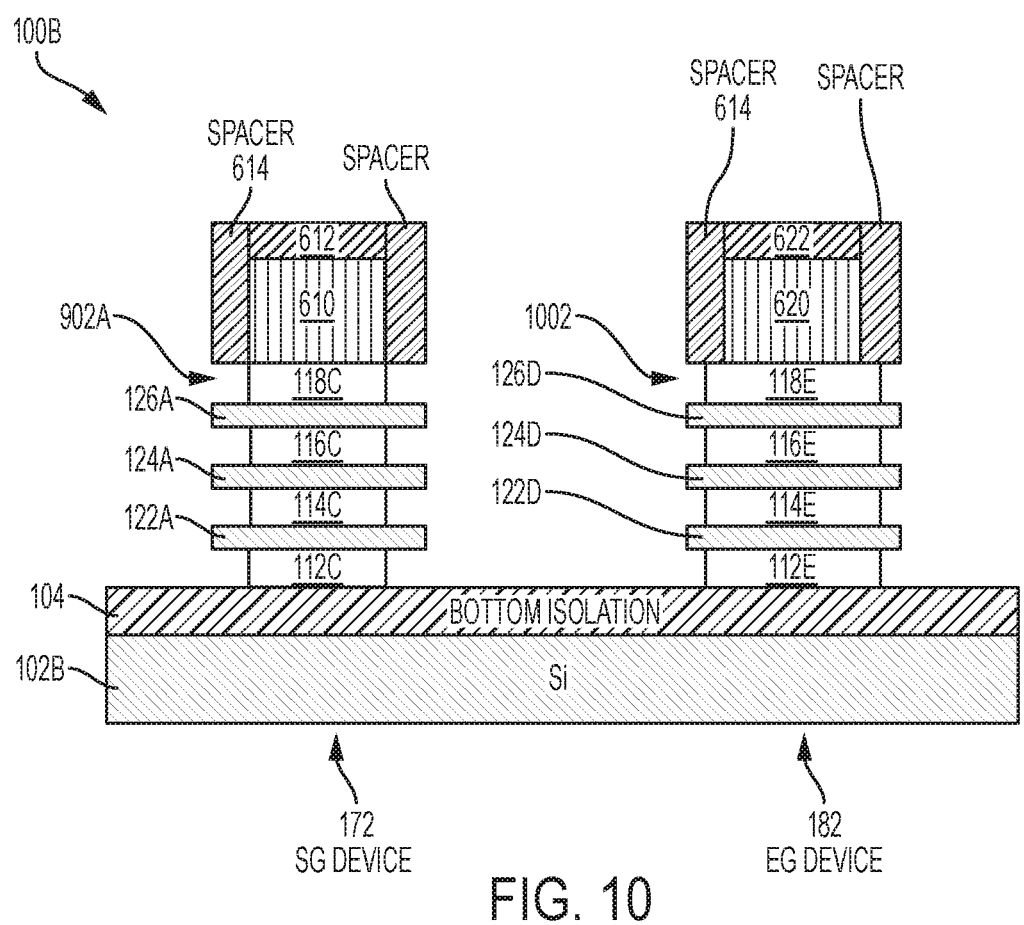

In FIG. 10, the block mask 802 has been removed, and a second pull-back process is applied to the end regions of the SiGe nanosheet regions 112B, 114B, 116B, 118B, 112D, 114D, 116D, 118D (shown in FIG. 9), thereby forming the SiGe sacrificial nanosheet regions 112C, 114C, 116C, 118C, 112E, 114E, 116E, 118E in the SG nanosheet transistor 172 and the EG nanosheet transistor 182, respectively. The distance of the second pull-back is sufficient to extend the thicknesses of the end region cavities 902 (shown in FIG. 9) to form end region cavities 902A, which now extends to the full target thicknesses for to-be-formed inner spacers 1102 (shown in FIG. 11) of the SG nanosheet transistor 172. In embodiments of the invention, the full target thicknesses of the end region cavities 902A are to at least about the thicknesses of the offset spacers 614. In other words, the end region cavities 902A, after the second pull-back operation, extend completely underneath the offset gate spacers 614.

The above-described second pull-back process also pulls back the end regions of the SiGe nanosheet regions 112D, 114D, 116D, 118D (shown in FIG. 9) in the EG nanosheet transistor 182 by the same amount as the pull-back applied to the end regions of the SiGe nanosheet transistors 112B, 114B, 116B, 118B, thereby forming end region cavities 1002. In accordance with embodiments of the invention, the difference between the thickness of the end region cavities 902A and the thickness of the end region cavities 1002 for a given SiGe sacrificial nanosheet (e.g., SiGe region 118C and SiGe region 118E) is substantially equal to the total EG thickness.

Figure 11:
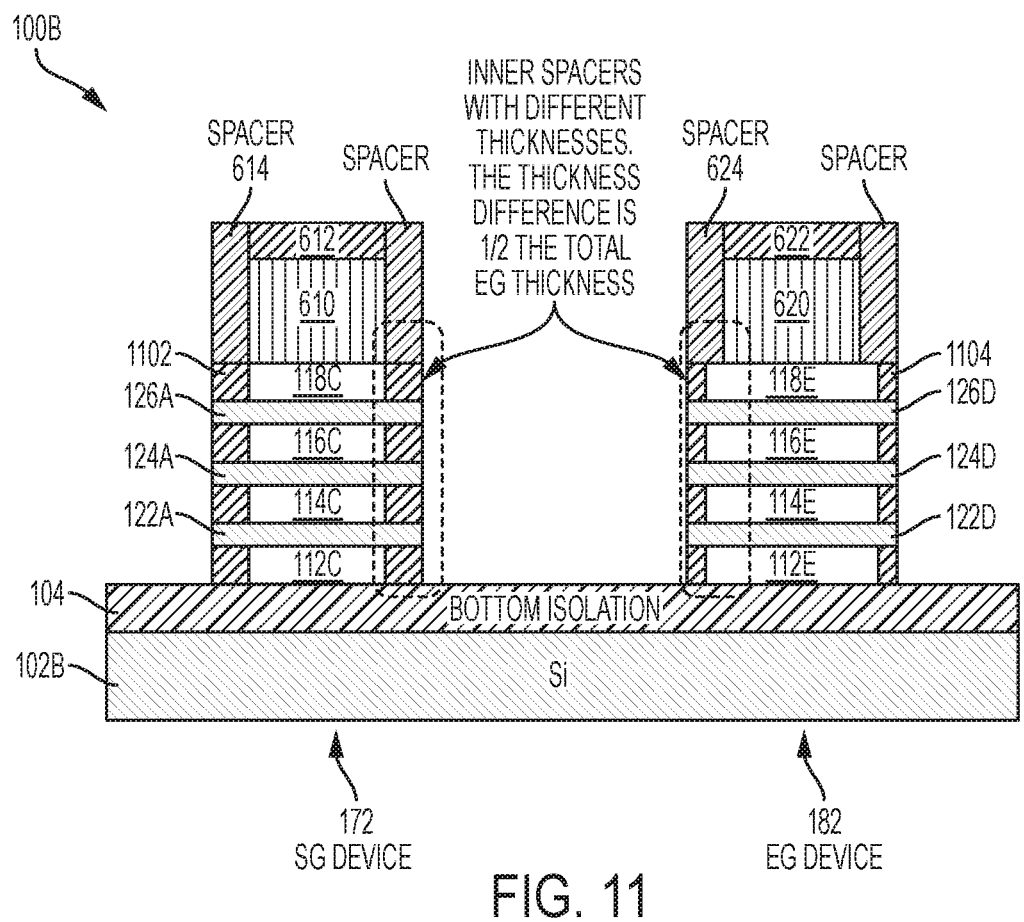

In FIG. 11, known semiconductor device fabrication processes have been used to form inner spacers 1102 in the cavities 902A, along with forming inner spaces 1104 in the cavities 1002. In embodiments of the invention, the inner spacers 1102, 1104 can be formed conformally by CVD, or by monolayer doping (MLD) of nitride followed by spacer RIE. The inner spacers 1102, 1104 can be formed from a nitride containing material (e.g., silicon nitride (SiN)), which prevents excess gauging during subsequent RIE processes (e.g., sacrificial SiGe layer removal) that are applied during the semiconductor device fabrication process. In accordance with aspects of the invention, each of the inner spacers 1102 has a different thickness than each of the inner spacers 1104. In accordance with aspects of the invention, for a given pair of SiGe sacrificial nanosheet regions (e.g., SiGe region 118C and SiGe region 118E), the difference between the thicknesses of each corresponding pair of inner spacers 1102 and the thickness of each corresponding pair of inner spacers 1104 is substantially equal to the total EG thickness.

Figure 12:
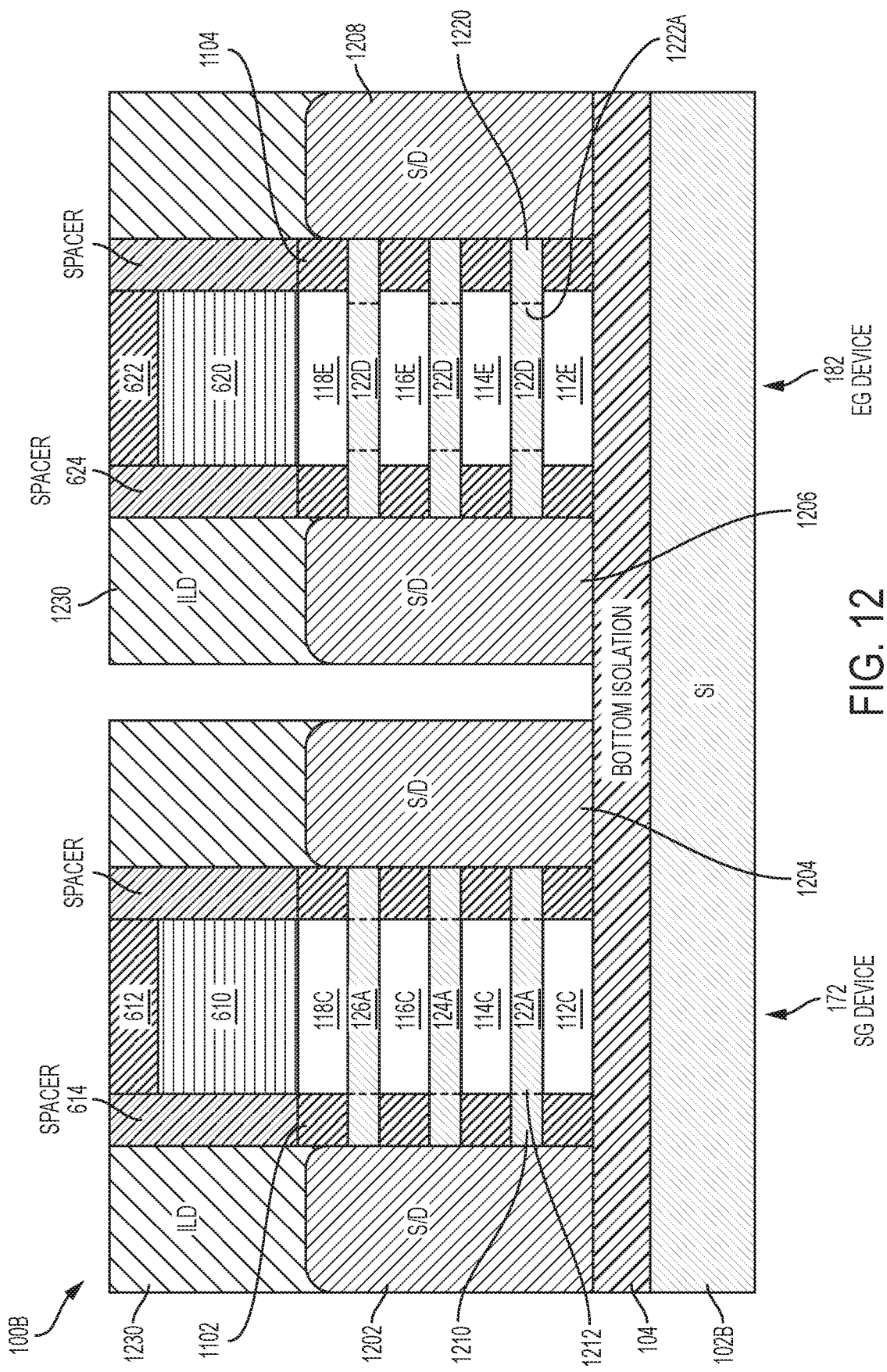

In FIG. 12, known semiconductor device fabrication processes have been used to form raised source/drain (S/D) regions 1202, 1204, 1206, 1208. In embodiments of the invention, the raised S/D regions 1202, 1204, 1206, 1208 are formed using an epitaxial layer growth process on the exposed ends of the Si channel nanosheet regions 122A, 124A, 126A in the SG nanosheet transistor 172, along with exposed ends of the Si channel nanosheet regions 122D, 124D, 126D in the EG nanosheet transistor 182. In some embodiments of the invention, the raised S/D regions 1202, 1204, 1206, 1208 can also be grown from exposed surfaces of the bottom isolation region 104 where the bottom isolation region 104 is a single crystalline material (e.g., a single crystalline silicon oxide). In-situ doping (ISD) is applied to form doped S/D regions 1202, 1204, 1206, 1208, thereby creating the necessary junctions in the SG nanosheet transistor 172 and the EG nanosheet transistor 182. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

In embodiments of the invention, the epitaxial growth and in-situ doping used to form the raised S/D regions 1202, 1204, 1206, 1208 are controlled in a manner that forms extension regions 1210, 1220 having extension junctions 1212, 1222 within the Si channel nanosheet regions (e.g., Si nanosheet regions 126A, 126D). Extension regions 1210, 1220 and extension junctions 1212, 1222 extend under offset spacers 614, 624, and the regions of the Si channel nanosheets (e.g., Si channel nanosheets 126A, 126D) under the gate dummy gates 610, 620 remain undoped. In embodiments of the invention, the doping of extension regions 1210, 1220 can be performed by implanting the end regions of the Si channel nanosheet regions 122A, 124A, 126A, 122D, 124D, 126D with ions (or dopants). Extension junctions 1212, 1222 reduce the $R_{ext}$ of the SG nanosheet transistors 172 and/or the EG nanosheet transistors 182 when they are turned on by applying the appropriate gate bias voltages. The extension junctions 1212, 1222 also form a conducting path between S/D regions 1202, 1204, 1206, 1208 and the Si channel nanosheet regions 122A, 124A, 126A, 122D, 124D, 126D. In order to optimize transistor performance, the extension junctions 1212, 1222 can be positioned such that they terminate in substantially the same plane that the final SG metal gate structure 202 (shown in FIG. 2) and the final EG metal gate structure 212 (shown in FIG. 2) begin.

In embodiments of the invention, substantially the same epitaxial growth and in-situ doping processes can be used to form the S/D regions, the extension regions 1210, 1220 and the extension junctions 1212, 1222 in the SG nanosheet transistors 172 and the EG nanosheet transistors 182, which allows the extension regions 1210, 1220 and the extension junctions 1212, 1222 to be formed to a substantially uniform extension region thickness and substantially the same relative extension junction locations (e.g., with respect to the terminating end of the metal gate) in the SG nanosheet transistors 172 and the EG nanosheet transistors 182. Because embodiments of the invention allow t1 (shown in FIG. 2) and t3 (shown in FIG. 2) to be substantially the same in the SG nanosheet transistors 172 and/or the EG nanosheet transistors 182, which allows the same junction formation process to be used to consistently position the SG extension junction 1212 and the EG extension junction 1222 with respect to the SG metal gate and the EG metal gate, respectively.

Referring still to FIG. 12, known semiconductor fabrication operations have been used to form an interlayer dielectric (ILD) region 1230. The ILD region 1230 can be formed by depositing an oxide material in bulk (e.g., silicon dioxide) and polishing the bulk oxide back (e.g., using CMP) to the level of the offset gate spacers 614, 624 and the hard masks 612, 622.

Figure 2:
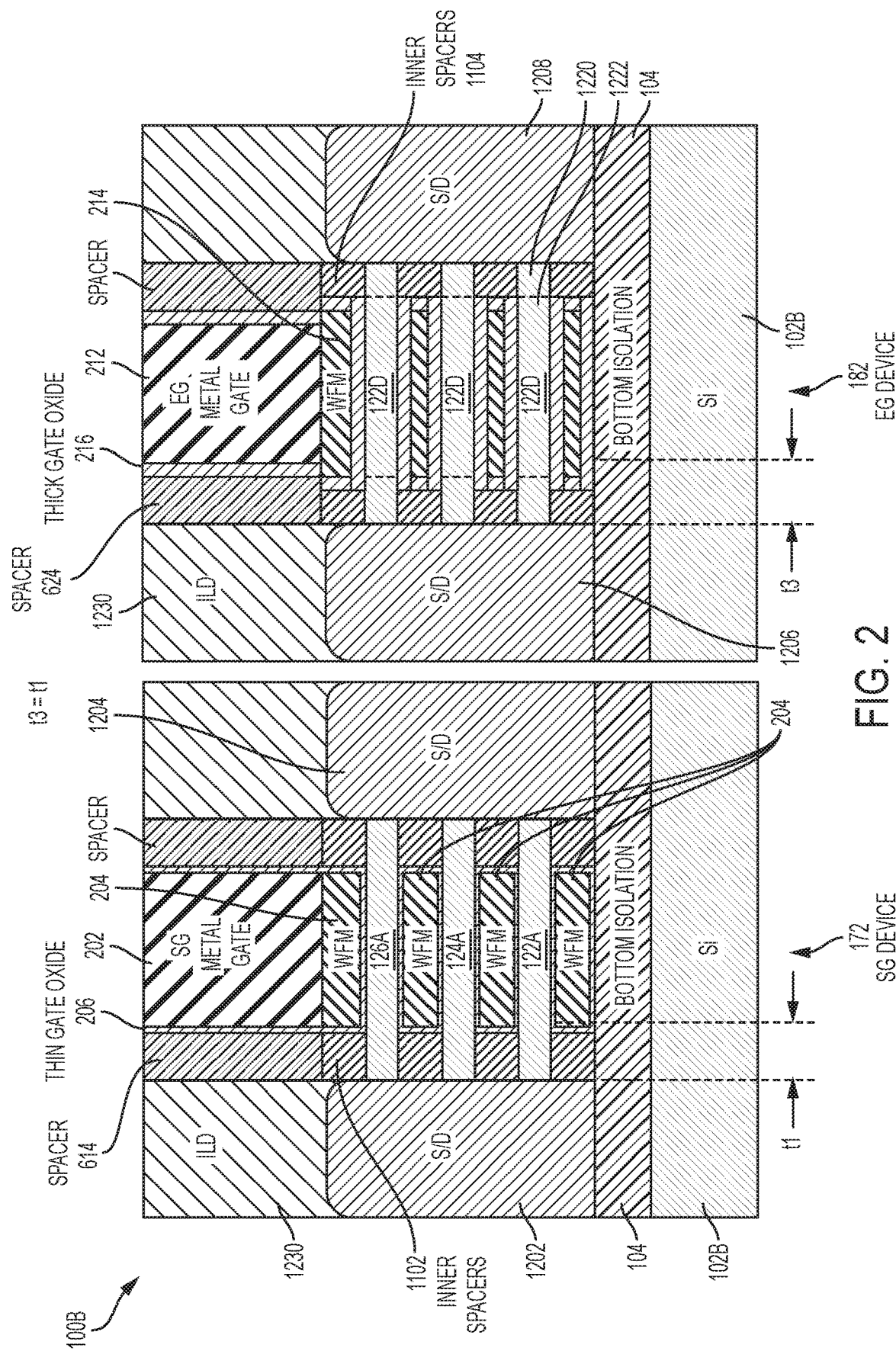
FIG. 2 depicts a cross-sectional view of a section of a substrate/wafer having an SG nanosheet transistor and an EG nanosheet transistor formed thereon according embodiments of the invention.

The results of fabrication operations subsequent to the fabrication operations shown in FIG. 12 are shown in FIG. 2, wherein the dummy gates 610, 620 and the hard masks 612, 622 have been removed. The dummy gates 610, 620 and the hard mask 612, 622 can be removed by a known etching process, e.g., RIE or chemical oxide removal (COR). Additionally, known semiconductor fabrication operations have been used to remove the SiGe sacrificial nanosheet central regions 112C, 114C, 116C, 118C, 112E, 114E, 116E (shown in FIG. 12). In embodiments of the invention, the SiGe sacrificial nanosheet regions 112C, 114C, 116C, 118C, 112E, 114E, 116E, 118E can be removed by applying a selective etch (e.g., a hydrochloric acid (HCl)).

In FIG. 2, known semiconductor fabrication processes (e.g., a gate-late fabrication process) have been used to replace the removed dummy gate 610 and the hard mask 612 with a multi-segmented SG metal gate structure 202, 204 and a relatively thin (e.g., from about 0.1 nm to about 1 nm) SG dielectric (e.g., silicon oxide) layer 206. In embodiments of the invention, the relatively thin gate dielectric layer 206 is between the Si channels 122A, 124A, 126A and the gate stack 202, 204 to prevent shorting. In embodiments of the invention, the gate metal structure can include a metal liner shown, e.g., a SG work-function metal (WFM) 204. In embodiments of the invention, the WFM 204 can be, for example, TiN or TaN, and the SG metal gate 202 can be aluminum or tungsten. The multi-segmented metal gate structure 202, 204 and the relatively thin gate dielectric layer 206 surround the stacked Si nanosheet channel regions 122A, 124A, 126A and regulate electron flow through the Si nanosheet channel regions 122A, 124A, 126A between the source 1202 and the drain 1204. In order to optimize transistor performance, the extension junctions 1212 can be positioned such that they terminate in the same plane that the final SG metal gate structure 202, 204 begins.

In FIG. 2, known semiconductor fabrication processes (e.g., a gate-late fabrication process) have been used to replace the removed dummy gate 620 and the hard mask 622 with a multi-segmented EG metal gate structure 212, 214 and a relatively thick (e.g., from about 1 nm to about 10 nm) EG dielectric (e.g., silicon oxide) layer 216. In embodiments of the invention, the relatively thick gate dielectric layer 216 is between the Si channels 122D, 124D, 126D and the gate stack 212, 214 to prevent shorting. In embodiments of the invention, the gate metal structure can include a metal liner shown, e.g., an EG work-function metal (WFM) 214. In embodiments of the invention, the WFM 214 can be, for example, TiN or TaN, and the EG metal gate 212 can be aluminum or tungsten. The multi-segmented metal gate structure 212, 214 and the relatively thick gate dielectric layer 216 surround the stacked Si nanosheet channel regions 122D, 124D, 126D and regulate electron flow through the Si nanosheet channel regions 122D, 124D, 126D between the source 1206 and the drain 1208. In order to optimize transistor performance, the extension junctions 1222 can be positioned such that they terminate in the same plane that the final EG metal gate structure (e.g., WFM 214) begins.

In FIG. 2, the distance from the S/D 1202 to the extension junction 1212 (i.e., the total thickness of the inner spacer 1102 and the SG dielectric layer 206) of the SG Si nanosheet channel (e.g., Si nanosheet channel 122A) is depicted in FIG. 2 as "t1," and the distance from the S/D 1206 to the extension junction 1222 (i.e., the total thickness of the inner spacer 1104 and the EG dielectric layer 216) of the EG Si nanosheet channel (e.g., Si nanosheet channel 122D) is depicted in FIG. 2 as "t3." According to embodiments of the invention, the thickness of the EG offset spacers 624 is reduced by a predetermined amount that corresponds to the EG distance. The predetermined amount is selected such that t1 can be made substantially equal to t3 at the same time that more room is provided in the EG nanosheet transistor 182 to accommodate the EG metal gate structure 212, 214. Because t1 is substantially equal to t3, substantially the same epitaxial growth and in-situ doping processes can be used to form the S/D regions 1202, 1204, 1206, 1208, the extension regions 1210, 1220, and the extension junctions 1212, 1222 in the SG nanosheet transistors 172 and the EG nanosheet transistors 182. Accordingly, aspects of the present invention enable the same junction formation process to be used to consistently position the SG extension junctions 1212 and the EG extension junction 1222s with respect to the SG metal gate and the EG metal gate, respectively.

FIGS. 13-19 depict cross-sectional views of section 100C of the substrate/wafer 102C (shown in FIG. 3) after various fabrication operations to form an SG nanosheet transistor 174 and an EG nanosheet transistor 184 on the same substrate 102C according to embodiments of the invention. In embodiments of the invention, known fabrication operations have been used to fabricate the SG nanosheet transistor 174 shown in FIG. 3. For ease of illustration and explanation, only the relevant fabrication operations for forming the EG nanosheet transistor 174 are illustrated in FIGS. 13-19.

Figure 3:
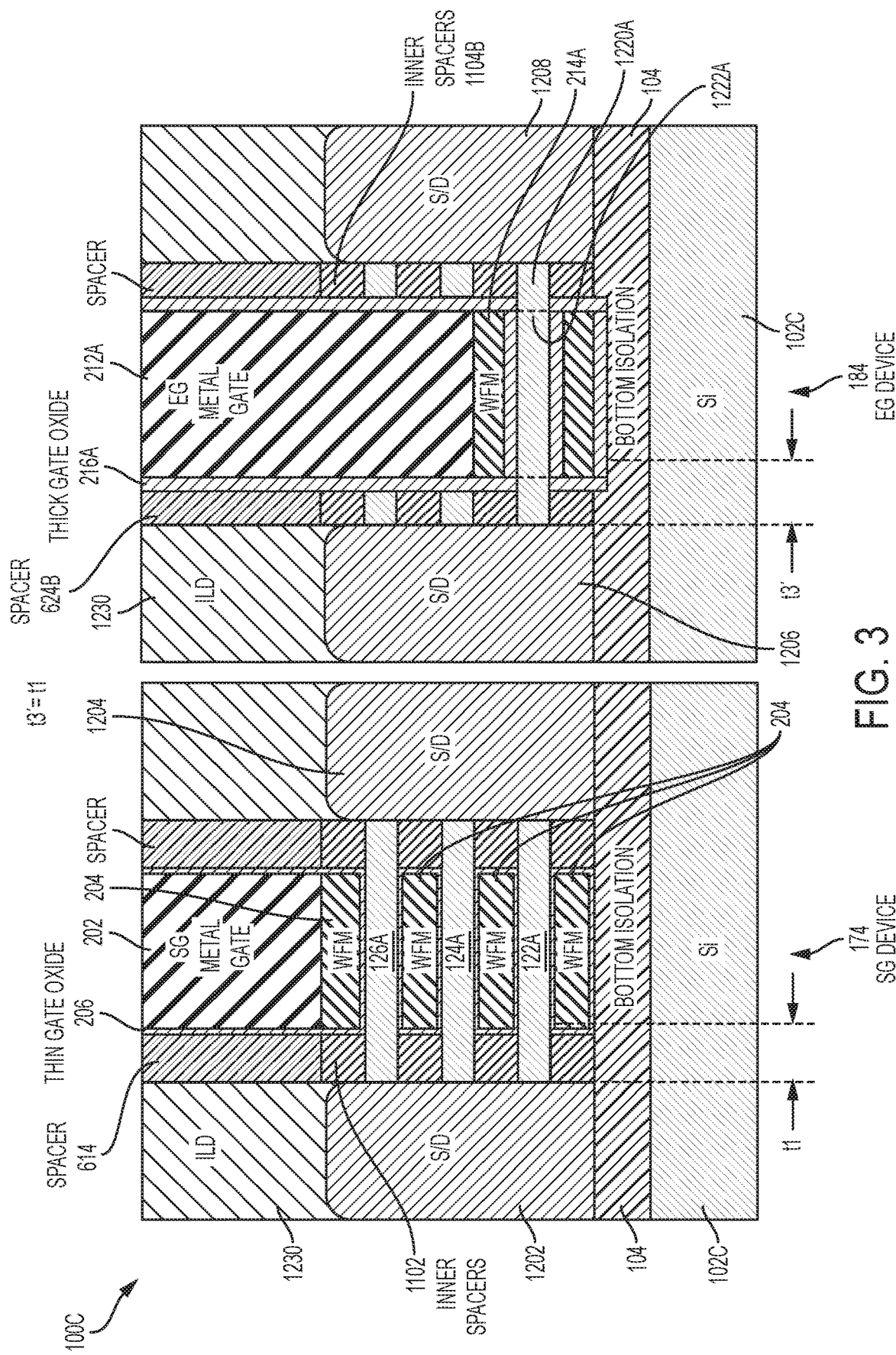
FIG. 3 depicts a cross-sectional view of a section of a substrate/wafer having an SG nanosheet transistor and an EG nanosheet transistor formed thereon according embodiments of the invention.

In embodiments of the invention, the SG nanosheet transistor 174 and the EG nanosheet transistor 184 can be fabricated until they are both at substantially the same stage as shown in FIG. 3. A block (not shown) can be formed over the EG nanosheet transistor 184, and additional known fabrication operations can be used to complete fabrication of the SG nanosheet transistor 174 shown in FIG. 3. The block over the EG nanosheet transistor 184, which is at the fabrication stage shown in FIG. 13, can be removed, and a block (not shown) is formed over the finished the SG nanosheet transistor 174 shown in FIG. 3. At the fabrication stage shown in FIG. 13, the thickness of the EG inner spacers 1104A are substantially same as the thickness of the SG inner spacers 1102 (shown in FIG. 3).

In FIG. 14, known fabrication operations have been used to remove the dummy gate 620A and the hard mask 622A. The dummy gate 620A and the hard mask 622A can be removed by a known etching process, e.g., RIE or chemical oxide removal (COR).

In FIG. 15, known semiconductor fabrication operations have been used to remove central regions of the SiGe sacrificial nanosheets 116G, 118G and central region of the Si channel nanosheets 124F, 126F, stopping into the SiGe sacrificial nanosheet 114G.

In FIG. 16, known semiconductor fabrication processes have been used to remove portions of Si nanosheet end regions 124G, 126G (shown in FIG. 15) selective to SiGe, thereby forming Si nanosheet recessed end regions 124H, 126H. The thickness of the Si nanosheet recessed end regions 124H, 126H are each selected to provide sufficient space for subsequent formation of a relatively thick EG gate dielectric (e.g., 216A shown in FIG. 3), an EG metal gate (e.g., 212A shown in FIG. 3), and an EG WFM metal (e.g., 214A). In other words, the distance by which the Si nanosheet end regions 124G, 126G are recessed is selected to substantially equal the previously described total EG distance.

In FIG. 17, known fabrication operations have been used to remove the remaining SiGe nanosheet regions 112G, 114G (shown in FIG. 16). In embodiments of the invention, the SiGe sacrificial nanosheet regions 112G, 114G can be removed by applying a selective etch (e.g., a hydrochloric acid (HCl)).

In FIG. 18, known fabrication operations have been used to conformally trim the thicknesses of the offset gate spacers 624A and the inner spacers 1104A to form offset gate spacers 624B and inner spacers 1104B. The thicknesses of the offset gate spacers 624B and the inner spacers 1104B are selected to be substantially the same as the trimmed Si nanosheet recessed end regions 124H, 126H. The offset gate spacer and inner spacer trim operations also remove portions of the bottom isolation 104. In embodiments of the invention, the conformal trim operation can be done by applying a wet etch (e.g., a hot phosphoric acid) if the spacer material is SiBCN. Because this process is conformal, the bottom isolation layer 104 (e.g., a silicon oxide) will also be attacked. Due to the selectivity difference in the wet etch, the etch amount in the bottom isolation layer 104 will not be as much as in the SiBCN spacers. For example, about a 3 to 1 selectivity difference can be expected.

In FIG. 19, a relatively thick (e.g., from about 1 nm to about 10 nm) EG gate dielectric layer 216A is deposited in the depicted regions of the EG nanosheet transistor 184. In embodiments of the invention, the relatively thick EG gate dielectric layer 216A is between the Si channel 122F and the gate stack 212A, 214A (shown in FIG. 3) to prevent shorting. In embodiments of the invention, the gate dielectric layer 216A can be formed from a silicon oxide-based material.

The results of fabrication operations subsequent to the fabrication operations shown in FIG. 19 are shown in FIG. 3, wherein an EG gate metal structure 212A and an EG WFM 214A have been deposited in the depicted regions of the EG nanosheet transistor 184. In embodiments of the invention, the EG WFM 214A can be, for example, TiN or TaN, and the EG metal gate 212A can be aluminum or tungsten. The multi-segmented metal gate structure 212A, 214A and the relatively thick EG dielectric layer 216A surround the Si nanosheet channel region 122F and regulate electron flow through the Si nanosheet channel region 122F between the source 1206 and the drain 1208. In order to optimize transistor performance, the extension junctions 1222A can be positioned such that they terminate in the same plane that the final EG gate structure (e.g., WFM 214A) begins.

In FIG. 3, the distance from the S/D 1202 to the SG Si nanosheet channel (e.g., Si nanosheet channel 122A) is depicted in FIG. 2 as "t1," and the distance from the S/D 1206 to the EG Si nanosheet channel (e.g., Si nanosheet channel 122D). According to embodiments of the invention, by reducing the thickness of the EG offset spacers 624 by a predetermined amount that corresponds to the EG distance, t1 can be made substantially equal to t2 while more room is provided in the EG nanosheet transistor 184 for the EG metal gate structure 212A, 214A.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   performing fabrication operations to form nanosheet field effect transistor devices on a substrate, wherein the fabrication operations include:
   forming a first nanosheet transistor device and a second nanosheet transistor device on a substrate;
   wherein forming the first nanosheet transistor comprises:
   forming a first inner spacer having a first inner spacer thickness dimension;
   forming a first gate dielectric, wherein a portion of the first gate dielectric comprises a first gate dielectric thickness dimension, wherein the portion of the first gate dielectric is positioned between the first inner spacer and a first gate; and
   forming a first nanosheet channel positioned under the first inner spacer and the portion of the first gate dielectric;
   wherein forming the second nanosheet transistor comprises:
   forming a second inner spacer having a second inner spacer thickness dimension;
   forming a second gate dielectric, wherein a portion of the second gate dielectric comprises a second gate dielectric thickness dimension, wherein the portion of the second gate dielectric is positioned between the second inner spacer and a second gate; and
   forming a second nanosheet channel positioned under the second inner spacer and the portion of the second gate dielectric;
   wherein:
   the first inner spacer thickness dimension is greater than the second inner spacer thickness dimension;
   the first gate dielectric thickness dimension is less than the second gate dielectric thickness dimension;
   the first inner spacer thickness dimension combined with the first gate dielectric thickness dimension defines a first combined thickness dimension;
   the second inner spacer thickness dimension combined with the second gate dielectric thickness dimension defines a second combined thickness dimension; and
   the first combined thickness dimension is substantially equal to the second combined thickness dimension
   using a single source/drain (S/D) region formation process to:
   form a first S/D extension region in the first nanosheet channel; and
   form a second S/D extension region in the second nanosheet channel; and
   wherein a thickness dimension of the first S/D extension region is substantially equal to a thickness dimension of the second S/D extension region.

2. The method of claim 1, wherein:
   forming the first nanosheet transistor further comprises forming a first nanosheet channel positioned under the first inner spacer and the portion of the first gate dielectric; and
   the first nanosheet channel comprises a first source/drain (S/D) extension region positioned under the first inner spacer and the portion of the first gate dielectric.

3. The method of claim 2, wherein forming the second nanosheet transistor further comprises forming a second nanosheet channel positioned under the second inner spacer and the portion of the second gate dielectric.

4. The method of claim 3, wherein the second nano sheet channel comprises a second source/drain (S/D) extension region positioned under the second inner spacer and the portion of the second gate dielectric.

5. The method of claim 4, wherein a terminating end of the first S/D extension region defines a first junction.

6. The method of claim 5, wherein a terminating end of the second S/D extension region defines a second junction.

7. The method of claim 6, wherein the first junction is substantially co-planar with an interface between the first gate dielectric and the first gate.

8. The method of claim 7, wherein the second junction is substantially co-planar with an interface between the second gate dielectric and the second gate.

9. A method of fabricating a semiconductor device, the method comprising:
   performing fabrication operations to form nanosheet field effect transistor devices on a substrate, wherein the fabrication operations include:
   forming a first nanosheet transistor device and a second nanosheet transistor device on a substrate;
   wherein forming the first nanosheet transistor comprises:

forming a first inner spacer having a first inner spacer thickness dimension;

forming a first gate dielectric, wherein a portion of the first gate dielectric comprises a first gate dielectric thickness dimension;

forming a first gate adjacent the first gate dielectric, wherein the portion of the first gate dielectric is between the first inner spacer and the first gate; and forming a first nanosheet channel positioned under the first inner spacer, the portion of the first gate dielectric, and the first gate;

wherein the first nanosheet channel comprises a first source/drain (S/D) extension region positioned under the first inner spacer and the portion of the first gate dielectric;

wherein the first nanosheet channel comprises a first nanosheet channel body positioned under the gate;

wherein forming the second nanosheet transistor comprises:

forming a second inner spacer having a second inner spacer thickness dimension;

forming a second gate dielectric, wherein a portion of the second gate dielectric comprises a second gate dielectric thickness dimension;

forming a second gate adjacent the second gate dielectric, wherein the portion of the second gate dielectric is between the second inner spacer and the second gate; and forming a second nanosheet channel positioned under the second inner spacer, the portion of the second gate dielectric, and the second gate;

wherein the second nanosheet channel comprises a second source/drain (S/D) extension region positioned under the second inner spacer and the portion of the second gate dielectric;

wherein the second nanosheet channel comprises a second nanosheet channel body positioned under the gate;

wherein:

the first inner spacer thickness dimension is greater than the second inner spacer thickness dimension;

the first gate dielectric thickness dimension is less than the second gate dielectric thickness dimension;

the first inner spacer thickness dimension combined with the first gate dielectric thickness dimension defines a first combined thickness dimension;

the second inner spacer thickness dimension combined with the second gate dielectric thickness dimension defines a second combined thickness dimension; and the first combined thickness dimension is substantially the same as the second combined thickness dimension; and using a single source/drain (S/D) region formation process to:

form a first S/D extension region in the first nanosheet channel; and form a second S/D extension region in the second nanosheet channel; and wherein a thickness dimension of the first S/D extension region is substantially equal to a thickness dimension of the second S/D extension region.

10. The method of claim 9, wherein:

forming the first nanosheet transistor further comprises communicatively coupling a first S/D region to the first S/D extension region, wherein a terminating end of the first S/D extension region defines a first junction; and forming the first nanosheet transistor further comprises communicatively coupling a second S/D region to the second S/D extension region, wherein a terminating end of the second S/D extension region defines a second junction.

11. The method of claim 10, wherein the first junction is substantially co-planar with an interface between the portion of the first gate dielectric and the first gate.

12. The method of claim 10, wherein the second junction is substantially co-planar with an interface between the portion of the second gate dielectric and the second gate.

13. The method of claim 10, wherein a distance from the first S/D region to the first junction is substantially the same as a distance from the second S/D region to the second junction.

14. The method of claim 10, wherein a distance from the first S/D region to the first nanosheet channel body is substantially the same as a distance from the second S/D region to the second nanosheet channel body.

15. A set of nanosheet field effect transistor devices formed on a substrate, the nanosheet field effect transistor devices comprising:

a first nanosheet transistor device and a second nanosheet transistor device formed on the substrate;

wherein the first nanosheet transistor comprises:

a first inner spacer having a first inner spacer thickness dimension;

a first gate dielectric, wherein a portion of the first gate dielectric comprises a first gate dielectric thickness dimension, wherein the portion of the first gate dielectric is positioned between the first inner spacer and a first gate;

a first nanosheet channel positioned under the first inner spacer and the portion of the first gate dielectric; and a first source/drain (S/D) extension region positioned under the first inner spacer and the portion of the first gate dielectric;

wherein the second nanosheet transistor comprises:

a second inner spacer having a second inner spacer thickness dimension;

a second gate dielectric, wherein a portion of the second gate dielectric comprises a second gate dielectric thickness dimension, wherein the portion of the second gate dielectric is positioned between the second inner spacer and the second gate;

a second nanosheet channel positioned under the second inner spacer and the portion of the second gate dielectric; and a second source/drain (S/D) extension region positioned under the second inner spacer and the portion of the second gate dielectric;

wherein:

the first inner spacer thickness dimension is greater than the second inner spacer thickness dimension;

the first gate dielectric thickness dimension is less than the second gate dielectric thickness dimension;

the first inner spacer thickness dimension combined with the first gate dielectric thickness dimension defines a first combined thickness dimension;

the second inner spacer thickness dimension combined with the second gate dielectric thickness dimension defines a second combined thickness dimension;

the first combined thickness dimension is substantially equal to the second combined thickness dimension; and a thickness dimension of the first S/D extension region is substantially the same as a thickness dimension of the second S/D extension region.

16. The device of claim 15, wherein:

a terminating end of the first S/D extension region defines a first junction; and a terminating end of the second S/D extension region defines a second junction.

17. The device of claim 16, wherein:

the first junction is substantially co-planar with an interface between the portion of the first gate dielectric and the first gate; and the second junction is substantially co-planar with an interface between the portion of the second gate dielectric and the second gate.

* * * * *